(12) United States Patent
Elrabaa

(10) Patent No.: US 9,188,627 B2
(45) Date of Patent: Nov. 17, 2015

(54) DIGITAL INTEGRATED CIRCUIT TESTING AND CHARACTERIZATION SYSTEM AND METHOD

(75) Inventor: Muhammad E. S. Elrabaa, Dhahran (SA)

(73) Assignee: KING FAHD UNIVERSITY OF PETROLEUM AND MINERALS, Dhahran (SA)

(*) Notice: Subject to any disclaimer, the term of this patent is extended or adjusted under 35 U.S.C. 154(b) by 821 days.

(21) Appl. No.: 13/471,346

(22) Filed: May 14, 2012

(65) Prior Publication Data
US 2013/0116961 A1    May 9, 2013

(51) Int. Cl.
| G01R 31/28 | (2006.01) |
| G06F 19/00 | (2011.01) |
| G01R 31/3185 | (2006.01) |
| G01R 31/319 | (2006.01) |

(52) U.S. Cl.
CPC ........ *G01R 31/28* (2013.01); *G01R 31/318569* (2013.01); *G06F 19/00* (2013.01); *G01R 31/31908* (2013.01)

(58) Field of Classification Search
CPC ........... G01R 31/28; G01R 31/318569; G01R 31/31908; G01R 31/31907; G01R 31/31713; G01R 31/2851; G01R 31/2884; G01R 31/2889; G01R 31/317; G01R 31/31712; G01R 31/318533; G01R 31/318536; G01R 31/318572; G01R 31/31903; G06F 19/00; G06F 11/267; G06F 11/3656
See application file for complete search history.

(56) References Cited

U.S. PATENT DOCUMENTS

| 4,901,259 | A |   | 2/1990 | Watkins |
| 6,049,901 | A | * | 4/2000 | Stock et al. .................... 714/726 |
| 7,203,873 | B1 | * | 4/2007 | Adams et al. .................. 714/718 |
| 7,813,462 | B2 |   | 10/2010 | de Obaldia et al. |
| 2001/0016929 | A1 | * | 8/2001 | Bonneau et al. ............... 714/735 |
| 2005/0182588 | A1 | * | 8/2005 | Chenoweth et al. .......... 702/118 |
| 2008/0040636 | A1 |   | 2/2008 | Mayer et al. |
| 2010/0102890 | A1 | * | 4/2010 | Stratz et al. ..................... 331/44 |
| 2011/0137604 | A1 |   | 6/2011 | Dasnurkar |

FOREIGN PATENT DOCUMENTS

| EP | 1 353 189 A2 | 10/2003 |
| WO | WO 9744678 A1 * | 11/1997 ........... G01R 31/319 |

* cited by examiner

*Primary Examiner* — Manuel L Barbee
(74) *Attorney, Agent, or Firm* — Richard C. Litman

(57) ABSTRACT

The digital integrated circuit testing and characterization system and method provides high-speed testing for digital IC prototypes. A stand-alone circuit, such as an application specific integrated circuit (ASIC) or a field programmable gate array (FPGA), implements a test and characterization processor (TACP). Supporting test circuitry is fabricated on board a prototyping chip to facilitate the test and characterization process. Test procedures and data may be downloaded to the TACP memory through a computer via a standard interface. The TACP administers the user-specified test procedures to one of several possible circuits on the prototyping chip. Test results are stored and collected via the on-board support test circuitry in communication with the TACP.

9 Claims, 13 Drawing Sheets

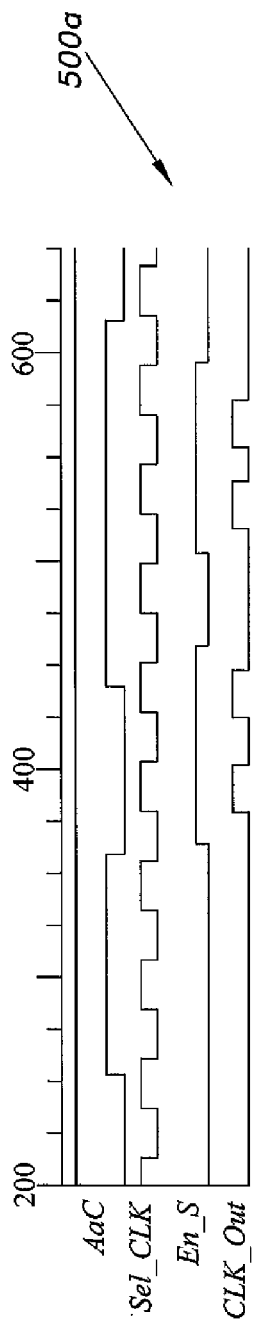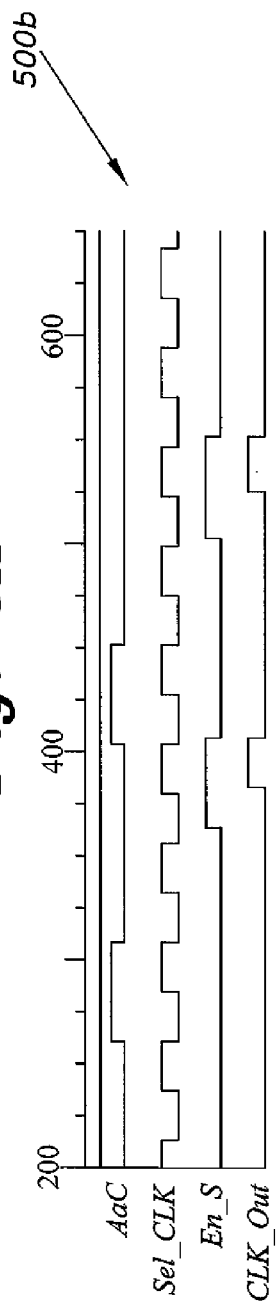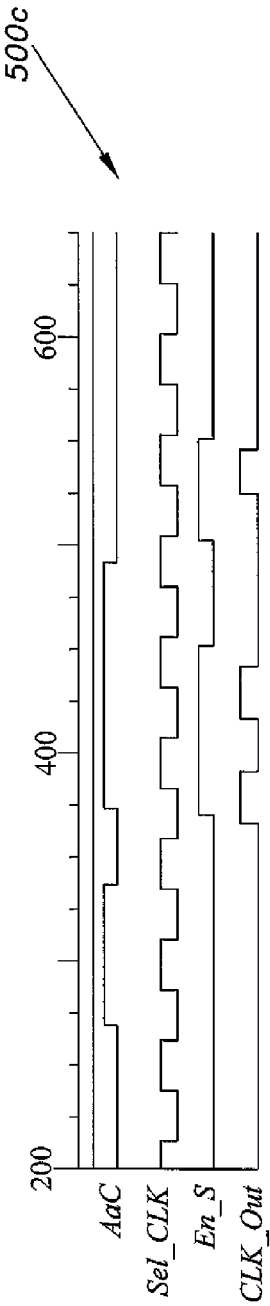

DIGITAL INTEGRATED CIRCUIT TESTING AND CHARACTERIZATION SYSTEM AND METHOD

BACKGROUND OF THE INVENTION

1. Field of the Invention

The present invention relates generally to integrated circuits, and particularly to a digital integrated circuit testing and characterization system and method that provides for high-speed testing and characterization of digital IC prototypes.

2. Description of the Related Art

Many university researchers and chip designers in small companies are faced with a huge problem when it comes to developing new electronic circuits or products, viz., the cost of testing. In order to verify their product/project outcome (i.e., the developed electronic chip), they need to fabricate a prototype, test it and characterize its performance. With the current speeds of a few gigahertz, these circuits would require very expensive testers and scopes.

The high cost of such testing equipment is definitely prohibitive for most universities. At the same time, trends in electronic design have converged in the last few years to what is known as an IP-based design. This is a design methodology based on re-using existing circuit blocks, namely the IP (intellectual property) blocks. These blocks are designed and verified (through prototyping and testing) by IP vendors and are then used and re-used by ASIC (application-specific integrated circuits) designers. This is a result of two factors, viz., very short time-to-market windows fueled by fierce competition and ever-increasing consumer expectations, and the high cost of design (designers' salaries). In fact, at the present time, most integrated circuits designed for electronic consumer products are being assembled from pre-designed, silicon-proven IP blocks.

Chip IPs are electronic circuits that are developed and licensed either as soft IPs (i.e., modeled using synthesizable Hardware-description languages, such as VHDL and Verilog) or as hard IPs (layout macros). In both cases, the IP vendors have to show Silicon proof of their IP's performance (i.e., performance figures based on prototyping). Developing a cost-effective solution that would enable circuit designers to prototype, test and characterize their IPs at operational speeds would be highly desirable.

Thus, a digital integrated circuit testing and characterization system and method solving the aforementioned problems is desired.

SUMMARY OF THE INVENTION

The digital integrated circuit testing system provides high-speed testing for digital IC prototypes. A stand-alone circuit, such as an application specific integrated circuit (ASIC) or a field programmable gate array (FPGA), implements a test and characterization processor (TACP). Supporting test circuitry is fabricated on-board a prototyping chip to facilitate the test and characterization process. Test procedures and data may be downloaded to the TACP memory through a computer via a standard interface. The TACP administers the user-specified test procedures to one of several possible circuits on the prototyping chip. Test results are stored and collected via the on-board support test circuitry in communication with the TACP.

These and other features of the present invention will become readily apparent upon further review of the following specification and drawings.

BRIEF DESCRIPTION OF THE DRAWINGS

FIG. 5A is a waveform diagram showing the correct operation of the CSAAC with AAC pulses of at least two cycles of SEL CLK in a digital integrated circuit test and characterization system according to the present invention.

FIG. 5B is a waveform diagram showing incorrect operation of the CSAAC due to insufficient AAC pulse width in a digital integrated circuit test and characterization system according to the present invention.

FIG. 5C is a waveform diagram showing incorrect operation of the CSAAC due to insufficient reset time between the AaC pulses in a digital integrated circuit test and characterization system according to the present invention.

DETAILED DESCRIPTION OF THE PREFERRED EMBODIMENTS

Figure 1:
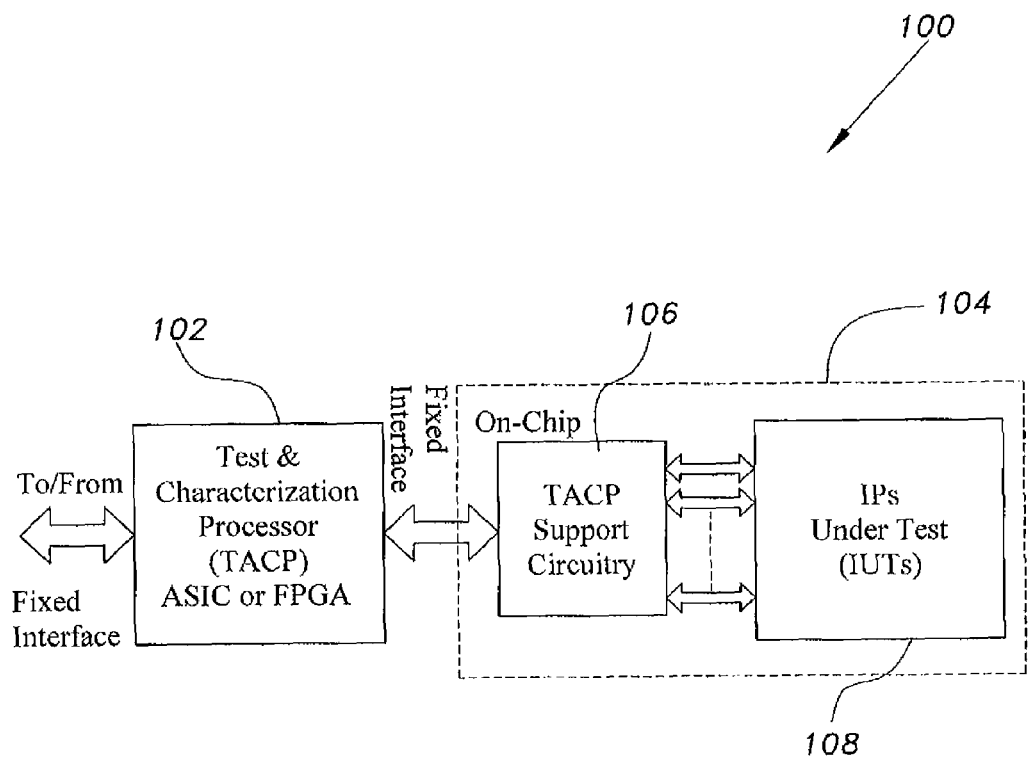
FIG. 1 is a block diagram of the architecture of a digital integrated circuit test and characterization system according to the present invention.

The digital integrated circuit testing and characterization apparatus 100 (shown in FIG. 1) provides high-speed testing for digital IC prototypes. A stand-alone circuit, such as an application specific integrated circuit (ASIC) or a field programmable gate array (FPGA), implements a test and characterization processor (TACP) 102 that can apply stimuli to and capture results from a digital integrated circuit under test. TACP supporting test circuitry 106 is fabricated on-board a prototyping chip 104 to facilitate the test and characterization of the intellectual property (IP) circuit under test (IUT) 108. A fixed or universal interface facilitates data exchange between the TACP 102 and the on-chip support circuitry 106.

Test procedures and data may be downloaded to the TACP 102 through a computer via a standard interface. The TACP 102 administers the user-specified test procedures to one of several possible circuits on the prototyping chip 104. Test results are stored and collected via the on-board support test circuitry 106 in communication with the TACP 102.

The TACP 102 has a first fixed interface that provides for connection to an external computer for receiving test instructions and data, and for sending the test results. The TACP on-chip support circuitry 106 provides a second fixed interface (i.e., the same interface circuit is used, regardless of the nature of the chip being tested; a custom interface circuit between the test controller 102 and the IUT 108 is unnecessary) to the TACP 102 and a controlled clock source 302 (shown in FIG. 3) for the IUT 108. All interfaces use serial data communications to save I/O pins.

Figure 2:
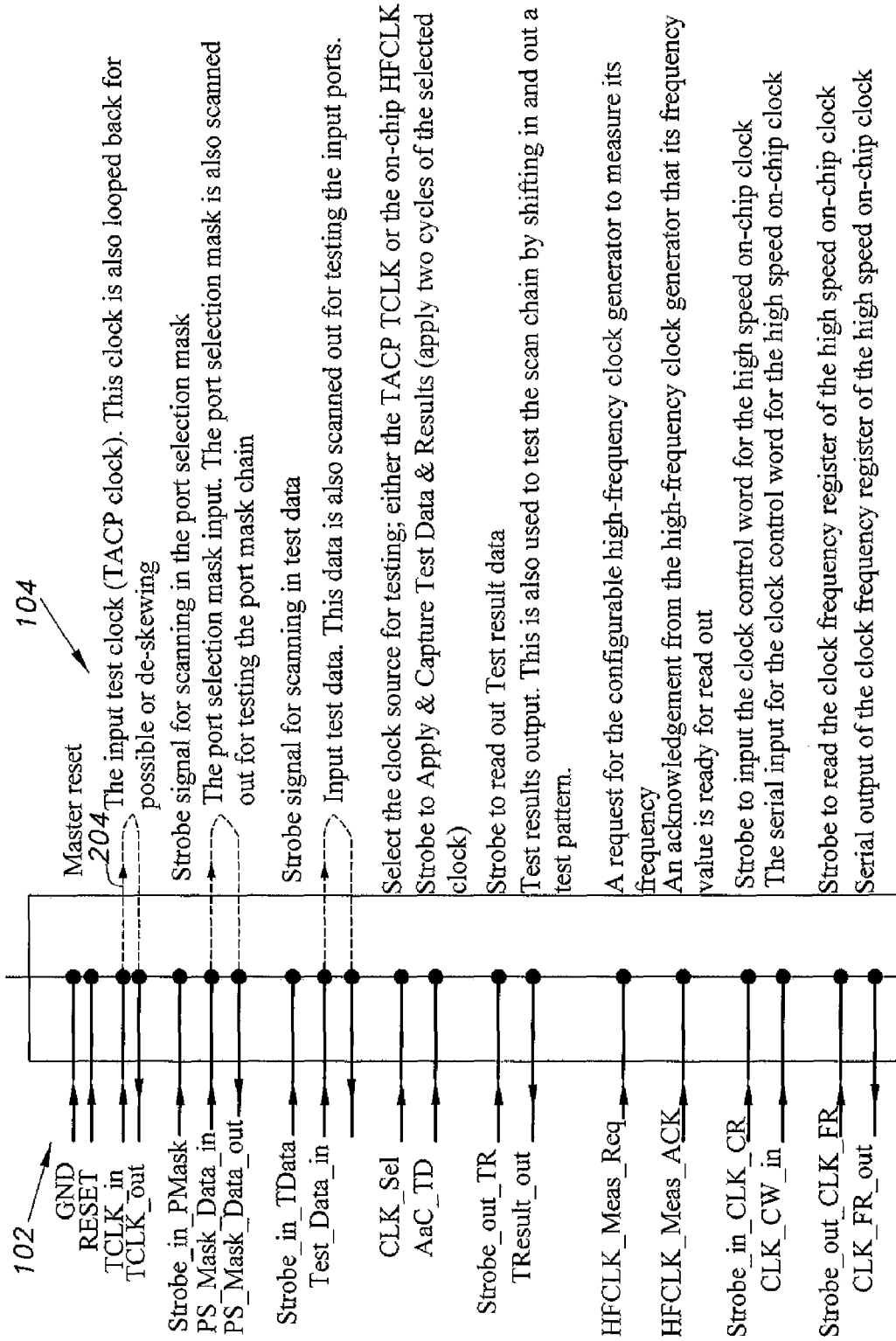
FIG. 2 is a schematic diagram of the fixed interface of a digital integrated circuit test and characterization system according to the present invention, showing the signal paths between the prototype being tested and the test and characterization processor (TACP).

As shown in FIG. 3, the TACP support circuitry 106 has a port selector, serial-to-parallel and parallel-to-serial data converters, and a controlled clock source 306. FIG. 2 shows the TACP 102, the prototype IC 104, and the fixed interface 103 between them. This fixed interface 103 does not change with any chip being tested or characterized. FIG. 3 most clearly shows the TACP support circuitry 106 in functional block form. The main components are the configurable clock generator 302, the port selection block 300, test application ports, such as test application ports (TAPs) and test result ports (TRPS). Arrangement of these ports effect Serial-to-Parallel and Parallel-to-Serial (SERDES) data conversion. To have fixed logic interfaces between the TACP 102 and the prototype chip 104, all data communications are serial. As such, the TACP support circuitry (TSC) 106 converts the received serial test data to parallel data to be applied to the IUT 108. It also converts back the captured test results from parallel form to serial form.

Figures 4A, 4B:
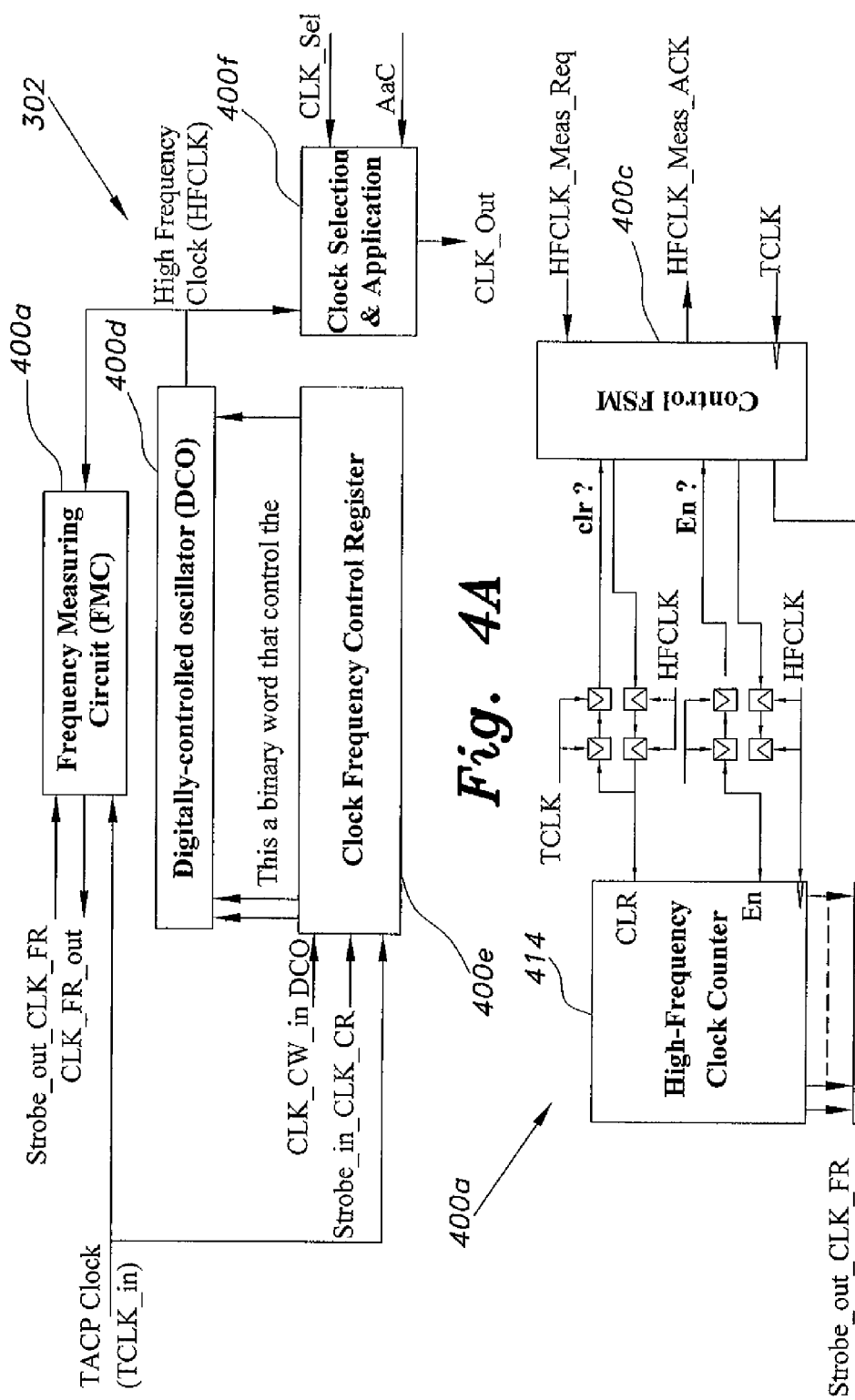
FIG. 4A is a block diagram of the frequency control and measuring circuitry in a digital integrated circuit test and characterization system according to the present invention.
FIG. 4B is a block diagram of the high frequency counter and control circuitry in a digital integrated circuit test and characterization system according to the present invention.
Figure 4C:
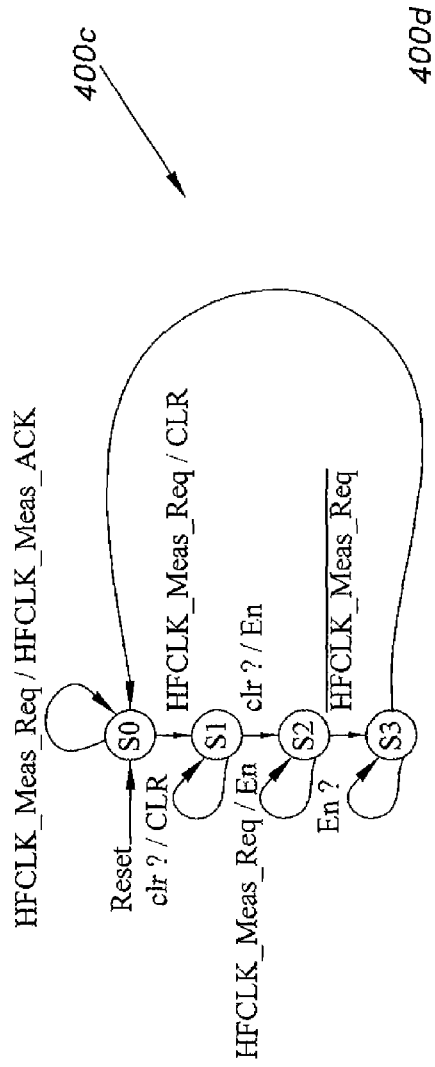
FIG. 4C is a state diagram showing state transitions of the frequency measuring circuitry in a digital integrated circuit test and characterization system according to the present invention.
Figure 4D:
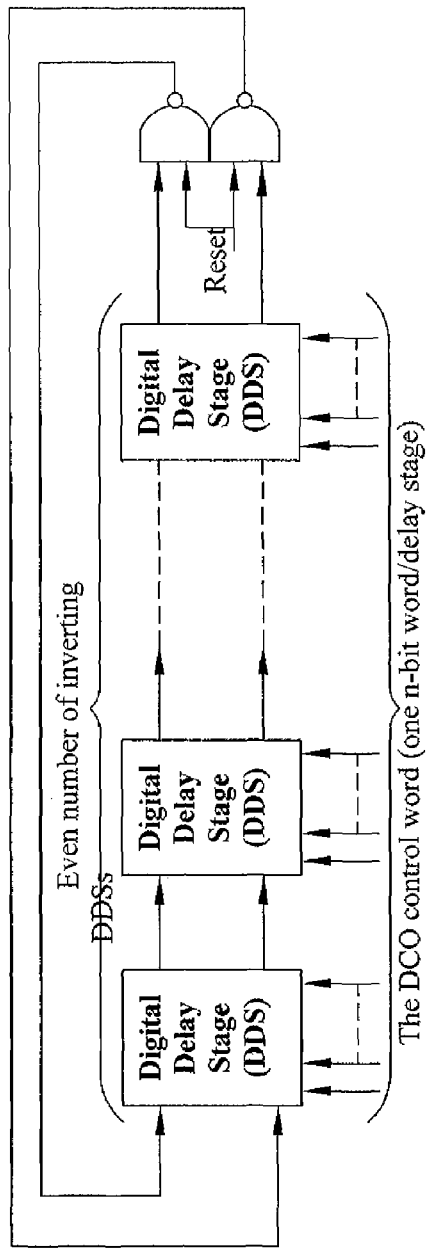
FIG. 4D is a block diagram showing the digital delay stages of the test and characterization circuitry in a digital integrated circuit test and characterization system according to the present invention.
Figure 4E:
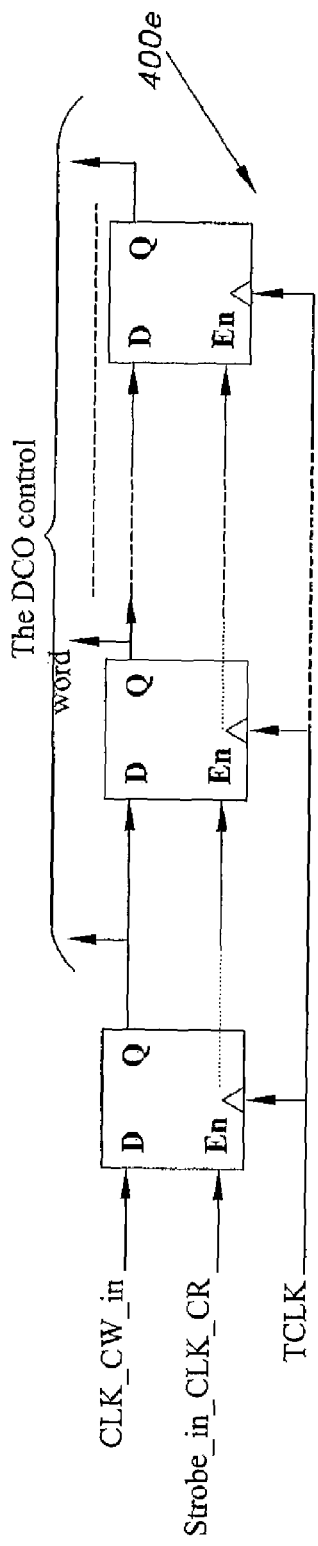
FIG. 4E is a block diagram showing the frequency control register of the test and characterization circuitry in a digital integrated circuit test and characterization system according to the present invention.
Figure 4F:
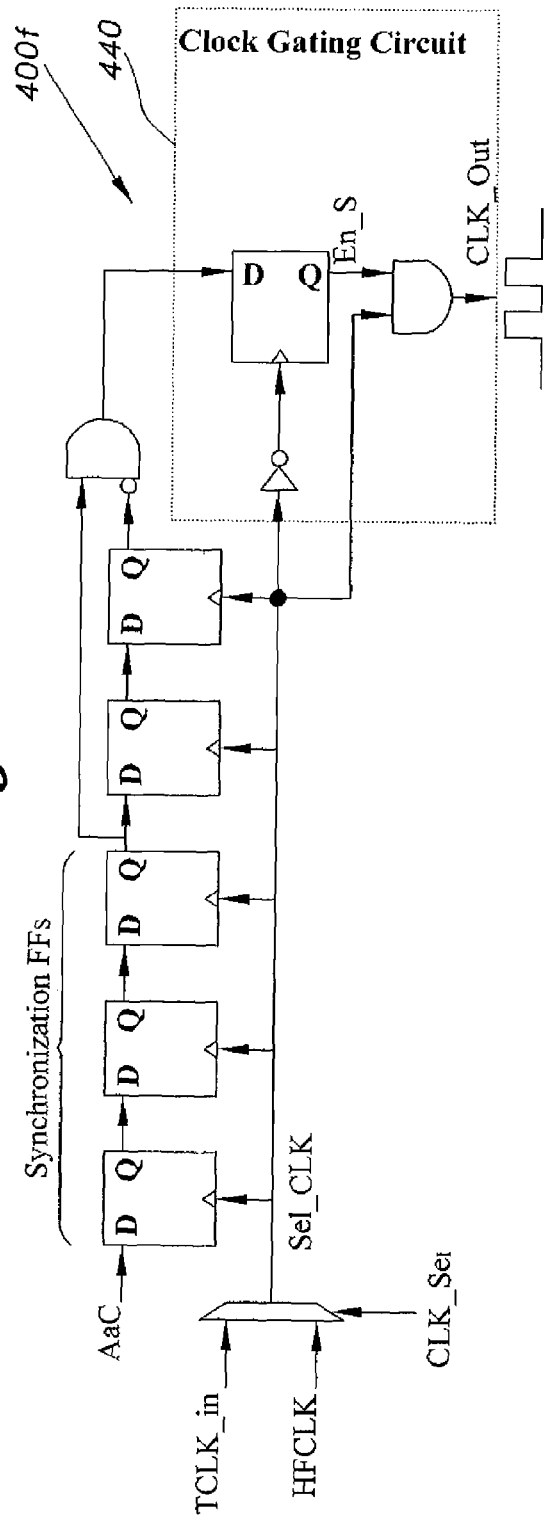
FIG. 4F is a block diagram showing the clock selection and application circuitry in a digital integrated circuit test and characterization system according to the present invention

The regular test clock 204 is coming from the off-chip TACP 102. The test clock 204 is kept at a moderate frequency (50~100 MHz). Hence, no special high-frequency transceivers or signal traces are required. This eases the design of the interface and keeps its cost to a minimum. At the same time, the clock 204 is adequate for scanning in/out the test data/results and performing functional characterization of the IUTs. Frequency characterization, however, requires a high-frequency clock source 302 (HFCLK) that can be configured to produce high-frequency clock pulses. This configurable clock generator 302 is placed on the prototype chip 104. The configurable clock generator 302, as illustrated in FIG. 4A, is made up of a frequency measuring circuit (FMC) 400a, a digitally-controlled oscillator 400d (DCO), and a clock frequency control register 400e, all operationally connected to a clock selection and application circuit 400f. FIG. 4B shows functional details of the FMC 400a, which includes a high-frequency clock counter and frequency register connected to the high-frequency clock via a control finite state machine 400c. State transitions of the Control FSM 400c are shown in FIG. 4C. The clock frequency control register 400e is detailed in FIG. 4E, and comprises D-type Flip Flop stages connected together in cascade, the Q-outputs forming a DCO control word. The DCO 400d is detailed in FIG. 4D and comprises cascading digital delay stages, including reset logic. The clock selection and application circuit is detailed in FIG. 4F, and comprises D-type Flip Flop stages connected together in a cascade that feeds a clock gating circuit, providing a clock output.

The FMC 400a, via a high-frequency clock counter 414, simply counts the number of high-frequency clock cycles within a certain period and puts the result in a frequency register 416, where the result is shifted out by the TACP 102 using the Strobe_out_CLK_FR strobe signal and through the CLK_FR_out pin. The measurement period is specified by the TACP 102 as the difference between activating the measurement request (HFCLK_Meas_Req) and deactivating the request. When the FMC 400a is done, it activates the acknowledgement signal (HFCLK_Meas_ACK), which remains high until a new measurement request is received. The user can control the accuracy of the measurement by programming a longer measurement period.

The clock selection and application circuit 400f (CSaAC) is responsible for selecting the required test clock (based on the CLK_Sel input signal from the TACP) and applying exactly two pulses of that clock to the selected TAP/TRP ports (in response to a strobe on the AaC input). The TACP 102 triggers the CSaAC by setting the AaC signal to high for at least two cycles of the selected clock (Sel_CLK). The CSaAC 400f will produce exactly two pulses of the selected clock for each AaC pulse, but in order for this circuit to fire again, the AaC signal must be reset for at least two cycles of the selected clock. The clock gating circuit 440 ensures that the two pulses applied are complete, with no glitches by enabling the output clock when the selected clock is low. The only constraint for the clock selection and application circuitry 400f is that the sum of the clock inverter delay, the flip flops' (FFs) clock to Q delay, and the clock-gating AND gate delay is less than the width of the negative pulse of the selected clock. Also, due to the required synchronization of the AaC input with the selected clock (3 FF synchronizer is used), the output clock pulses will have a latency of 3 cycles of the selected clock. The TACP 102 takes care of all these issues by applying the AaC signal for two TCLK_in cycles (TCLK_in frequency is always ≤ the selected clock frequency), and then resetting it for two more cycles before setting it again (in case of successive apply and capture commands).

FIGS. 5A-5C show logic simulation results of the CSaAC with unit gate delays. Plot 500a of FIG. 5A shows how the circuit functions correctly when the AaC pulse is at least two cycles of Sel_CLK, and also the reset time in between AaC pulses is at least two cycles. When the AaC pulse is less than two cycles, or the reset time in-between pulses is less than two cycles, the circuit fails, as shown in plot 500b of FIG. 5B and plot 500c of FIG. 5C, respectively.

Figure 6:
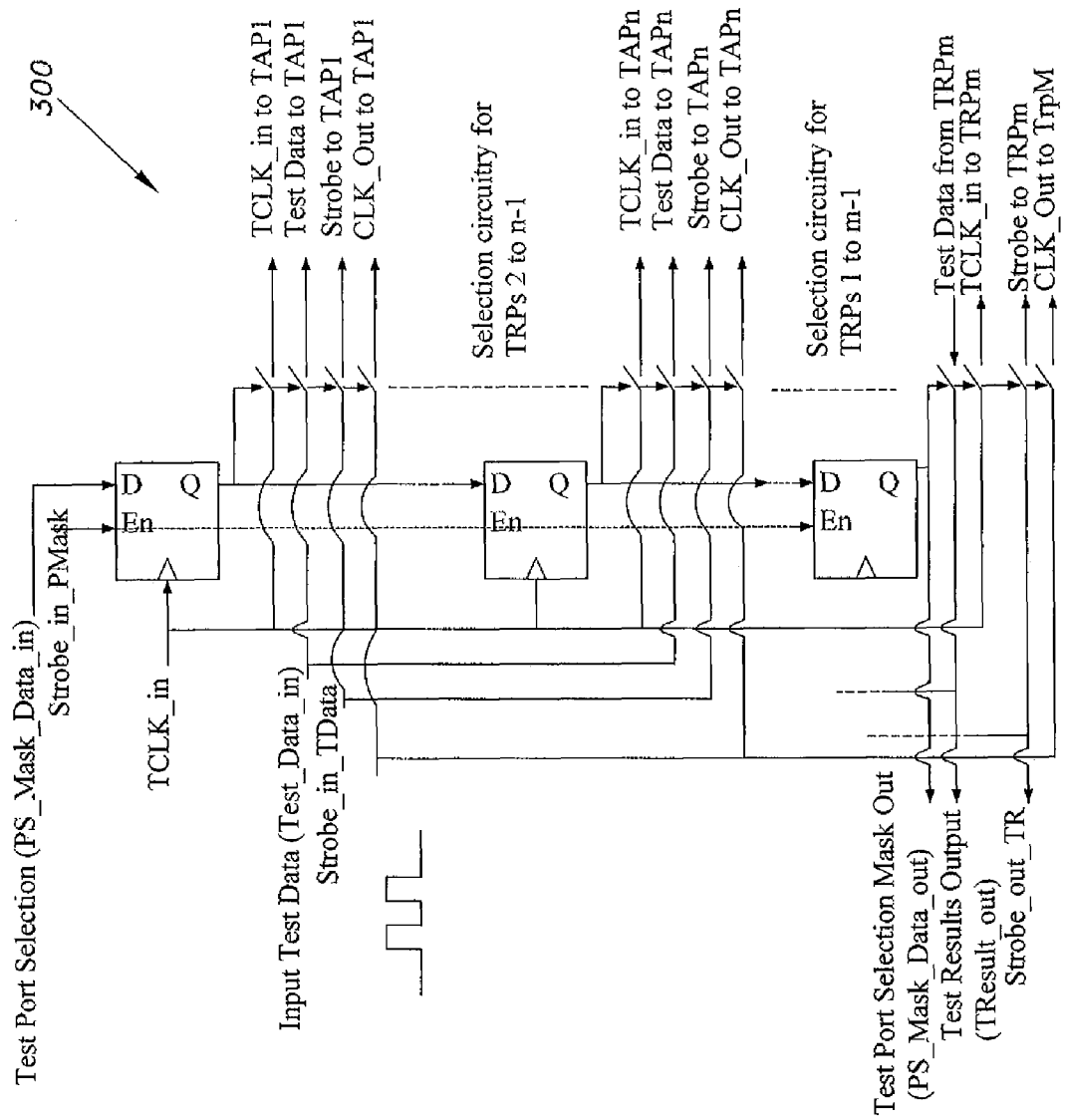
FIG. 6 is a detailed circuit diagram of the port selection circuitry in a digital integrated circuit test and characterization system according to the present invention.

The port selection block 300 is responsible for selecting a specific test application/test result port to deliver the strobes, test clock and input test data to or receive test results from the prototype chip. The user can select a single input/output port, or two ports (one input and one output). To make this block general, yet with a fixed interface to the TACP 102, the port selection block 300 comprises cascading basic D-type cells, as shown in FIG. 6. The selection mask is loaded serially through the PS_Mask_Data_in input using the Strobe_in_P-Mask strobe signal. The TACP 102 supports a variable-length selection mask (up to $2^{16}$ bits). The port selection mask is also read out through PS_Mask_Data_out for testing the selection chain.

Figure 3A:
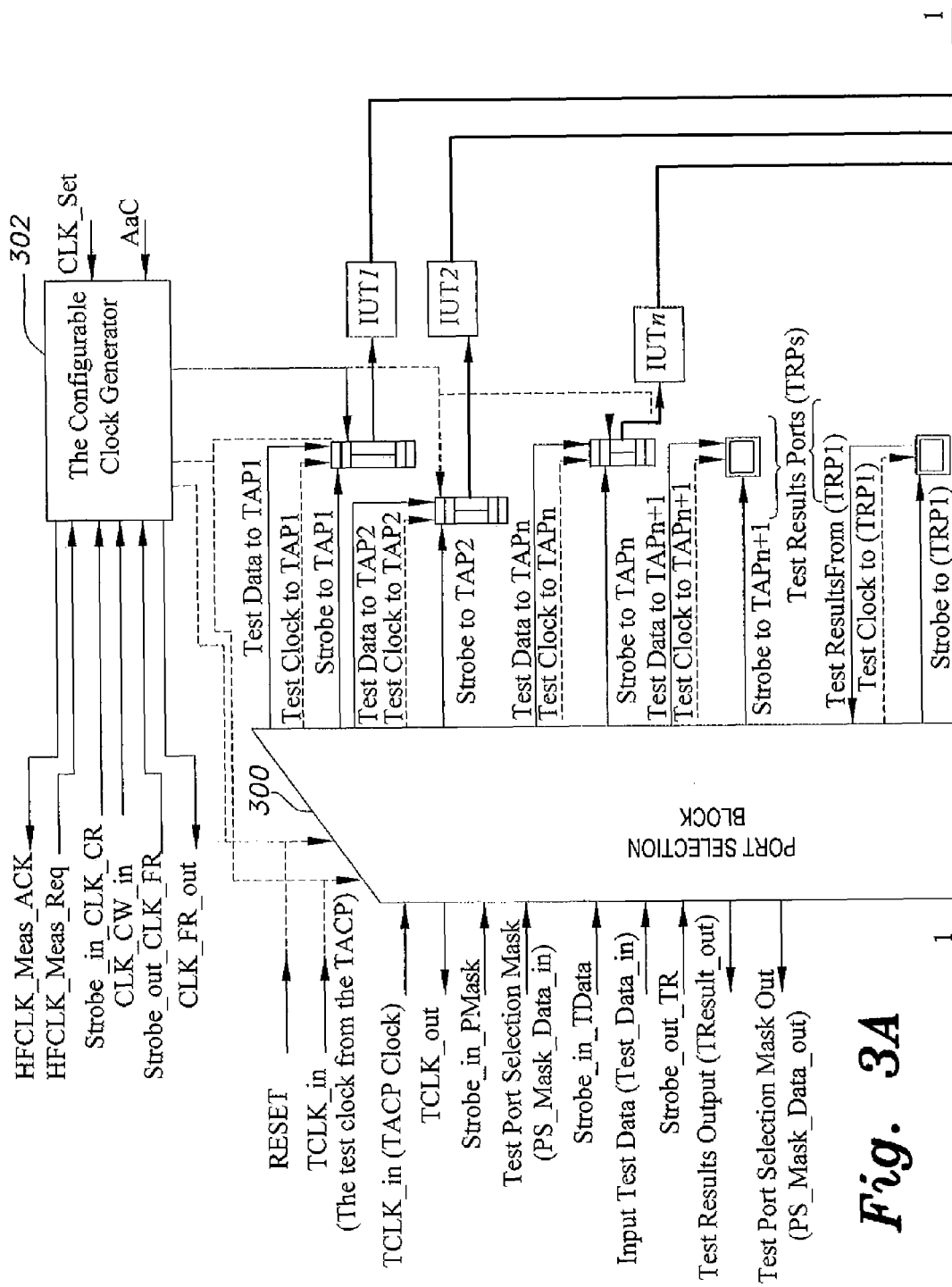
FIGS. 3A-3B are a schematic diagram illustrating the TACP support circuitry in a digital integrated circuit test and characterization system according to the present invention
Figure 3B:
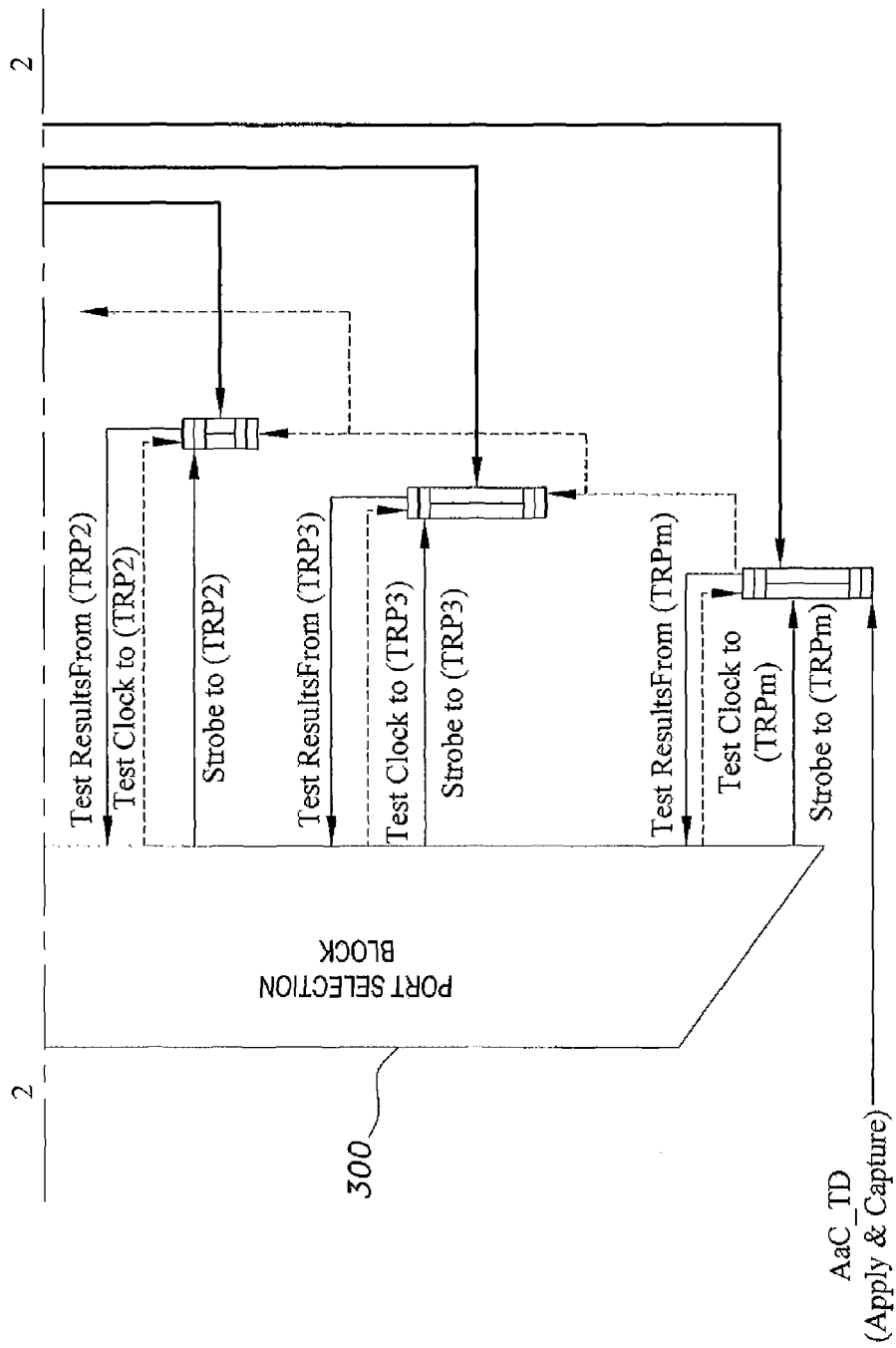
Figure 7A:
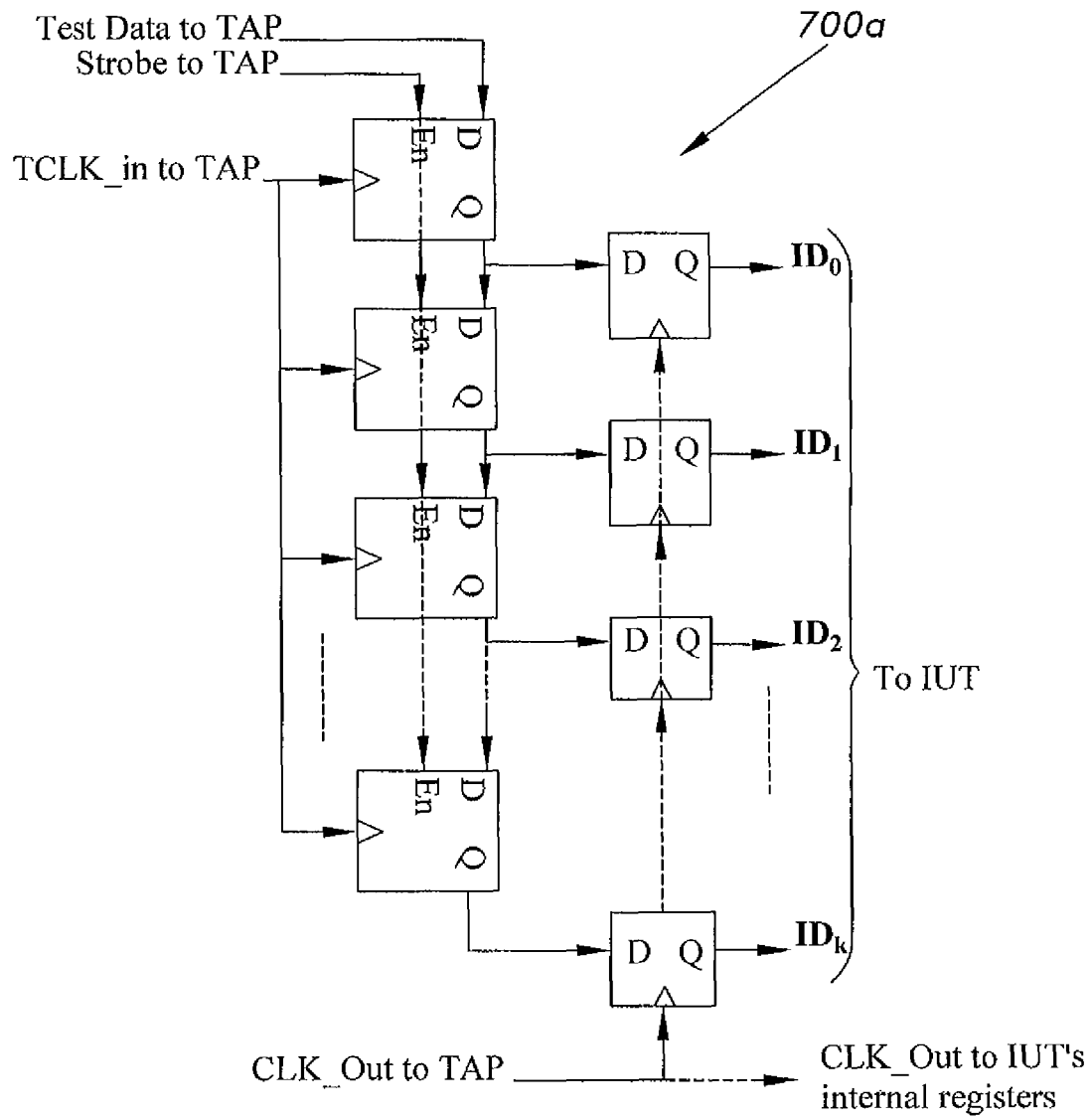
FIG. 7A is a block diagram showing a k-bits wide test application port in a digital integrated circuit test and characterization system according to the present invention.
Figure 7B:
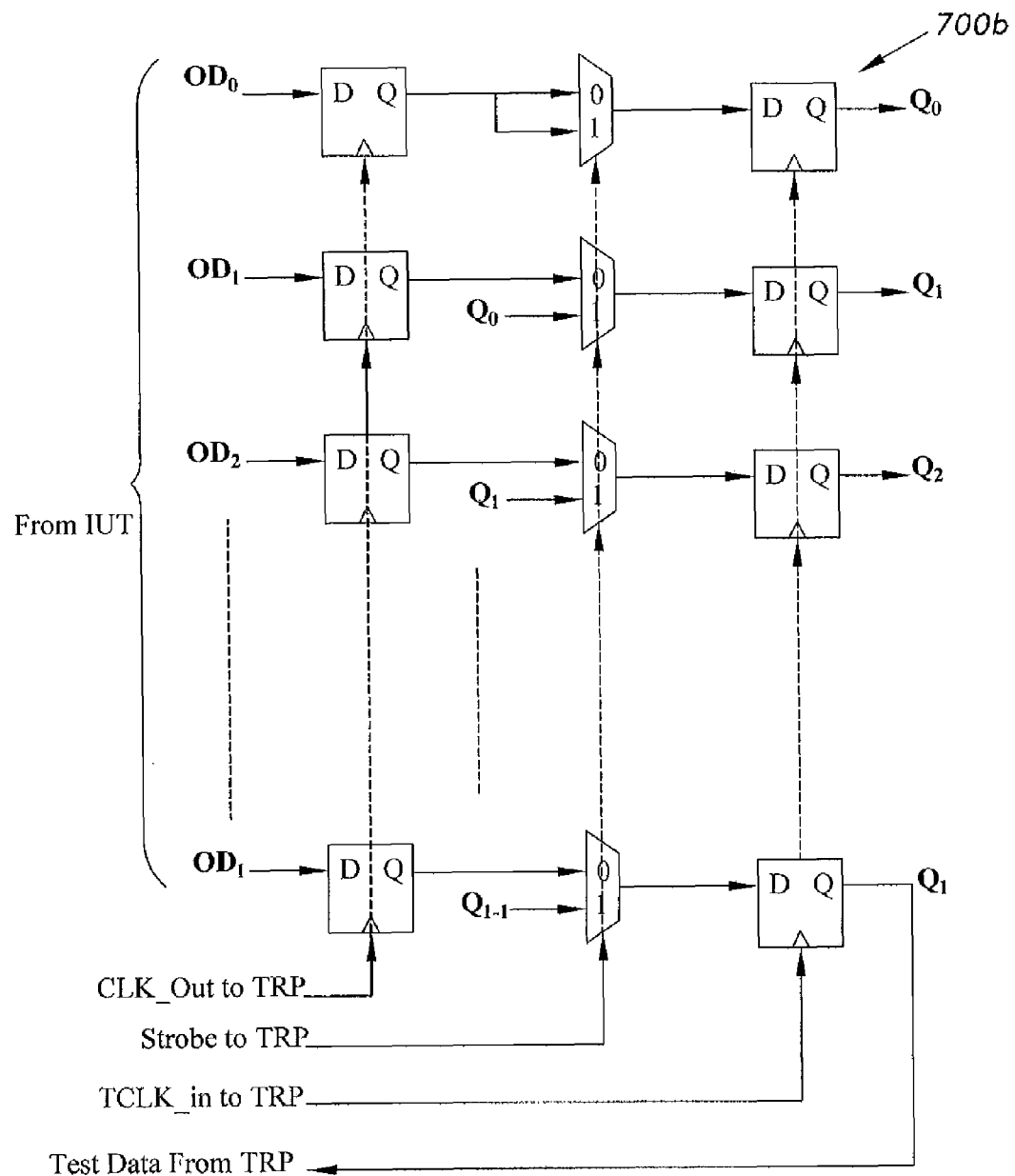
FIG. 7B is a block diagram showing an l-bit wide test results port in a digital integrated circuit test and characterization system according to the present invention.

There are two types of test application/result ports, as illustrated in FIGS. 3A-3B. The first type features a k-bits wide test application port (TAP) 700a, as shown in FIG. 7A, and an l-bits wide Test Results Port (TRP) 700b, as shown in FIG. 7B, in which TAP 700a and TRP 700b are used for applying and capturing primary inputs/outputs of an IUT 108. The TAP 700a and TRP 700b are similar to boundary scan ports, and are made of shift registers for scanning in/out the test data/results and parallel-load registers for applying/capturing the test data/results. Each TAP 700a or TRP 700b is made of a cascaded number of identical cells equal to the port's data width. The shift registers use the TCLK_in, and the application/capture registers use the selected apply and capture clock (CLK_Out). The CLK_Out clock is also used for the IUT's internal registers. For the TRP 700b, the TACP 102 needs to apply at least one TCLK_in cycle (to load the test results into the shift register) before activating the Strobe_out_TR signal to read out the test results.

Figure 7C:
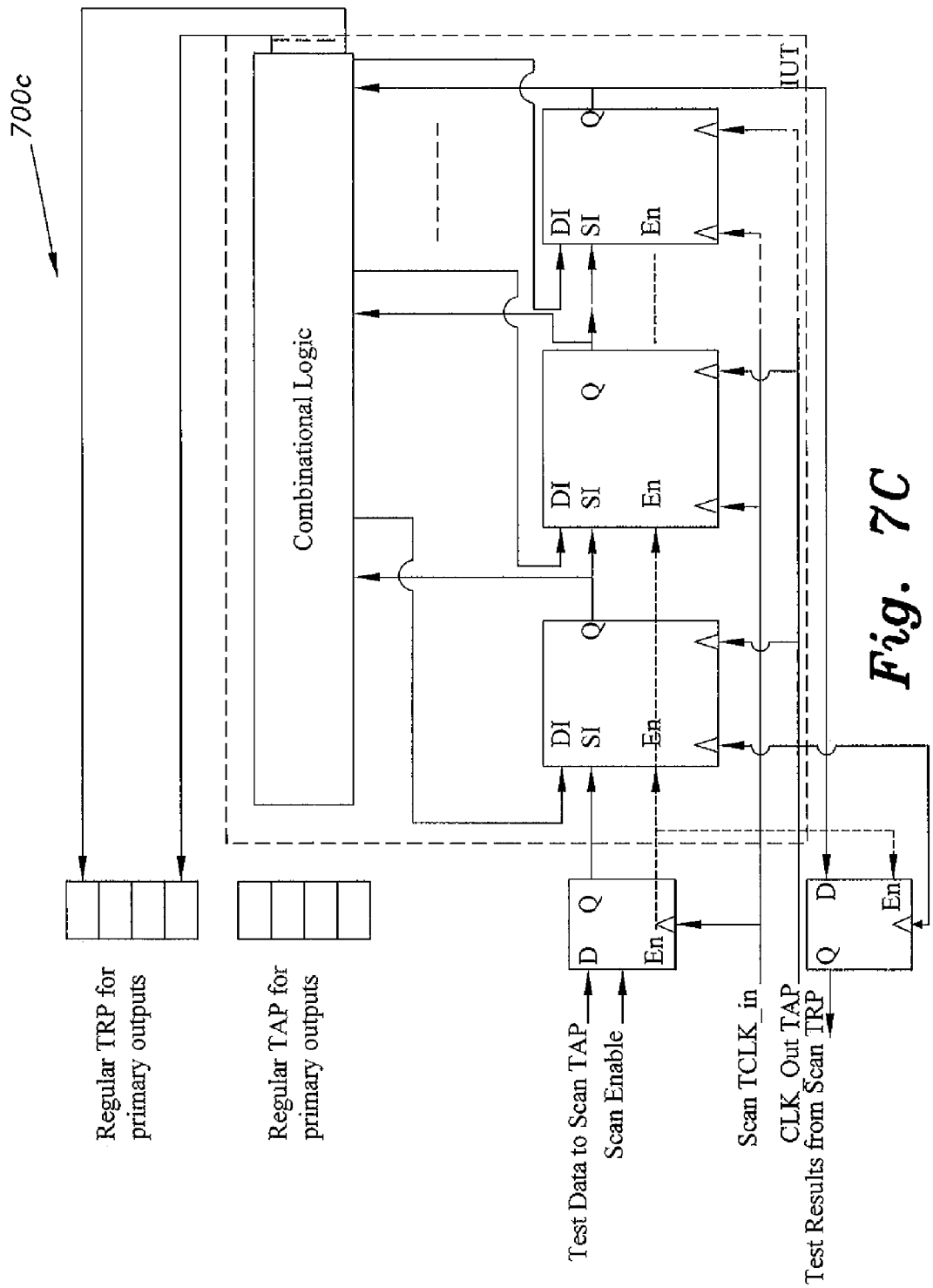
FIG. 7C is a block diagram showing a scan test application results port in a digital integrated circuit test and characterization system according to the present invention.
Figure 7D:
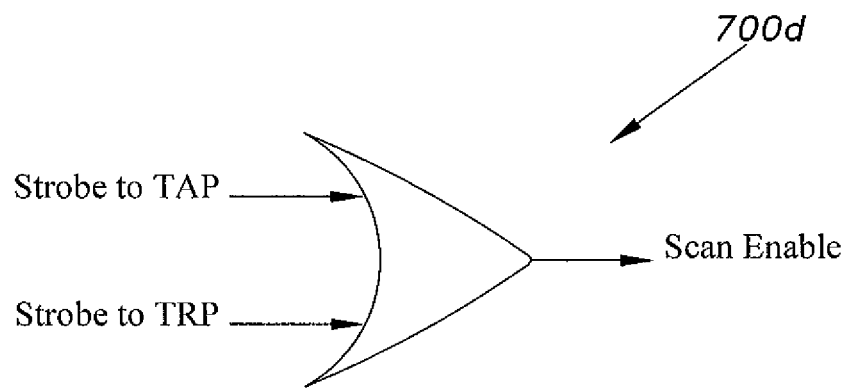
FIG. 7D is a component schematic diagram showing a strobe and scan enable OR gate in a digital integrated circuit test and characterization system according to the present invention.
Figure 7E:
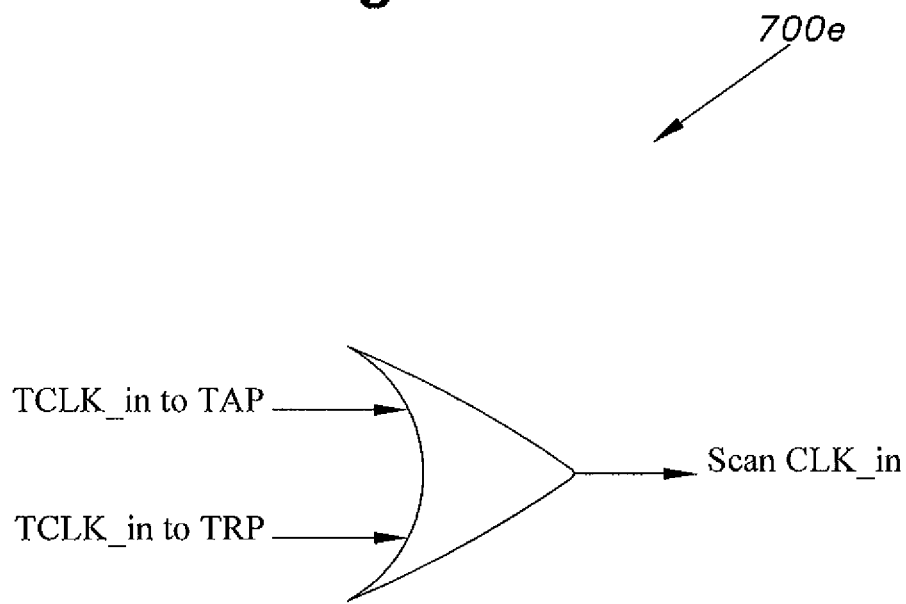
FIG. 7E is a component schematic diagram showing a TCLK and scan clock in OR gate in a digital integrated circuit test and characterization system according to the present invention.

IP designers may also need to use full-scan designs in addition to/or instead of boundary-scan. This requires making all or part of the internal Flip Flops scannable (forming one long scan chain). Such scan chains could be used for debugging/diagnostics of an IUT's internal circuitry, or to fully test a sequential circuit, which is impossible to do using only primary inputs/outputs. Special TAP/TRP scan ports are included for scan chain inputs/outputs 700c of IUTs, as shown in FIG. 7c. These ports have to be used (i.e. selected) in pairs, where data is shifted through the chain when either the Strobe_in_TR or the Strobe_out_TR signals is activated. The TCLK_in, Scan_En and CLK_Out signals are made available for the internal scan FFs of the IUT 108. A scan enable signal is provided by scan Enable gate 700d. A scan CLK_in signal is provided by a Scan CLK_in gate 700e, which takes TCLK inputs from the TAP 700a and the TRP 700b.

Regular TAP/TRP ports are used for non-scan primary inputs and outputs of the IUT 108. The TACP instructions support shifting test data in, shifting test results out, or simultaneously shifting in and out test data and results, respectively.

The TACP 102 is a special-purpose processor implemented as a data path and a micro-coded control unit. The data path is made of shift registers for shifting data out/in, and counters to count the number of data bits shifted. The control unit decodes the test instructions, loads the counters with the length of bit streams, and controls the shift registers. The TACP's memory is partitioned into three partitions, including one for instructions, another for test data, and another for test results. The memory is under direct control of the host computer that would download test instructions and data and upload test results.

The host communicates with the TACP 102 via a very simple protocol using fixed-size packets with a header that specifies the packet type and the required action from the TACP 102. Special interactive configuration commands allow the host to read the on-chip HFCLK frequency, increase it or decrease it.

Other commands also allow the host to set the TACP frequency (TCLK) and read out its internal registers for debugging purposes. The TACP 102 has special instructions for port selection, shifting out test data, shifting in test results, apply and capture test data/results, comparing test results with some value, conditional statements and loops. The simple TACP architecture allows the addition of more instructions, if needed, in future revisions.

It is to be understood that the present invention is not limited to the embodiments described above, but encompasses any and all embodiments within the scope of the following claims.

I claim:

1. A digital integrated circuit testing and characterization method, comprising the steps of:
   providing stand-alone test circuitry for a digital integrated circuit under test, the stand-alone test circuitry including a first set of I/O ports arranged in a first fixed interface circuit operable with any digital integrated circuit under test, the first fixed interface circuit being adapted for interfacing the stand-alone test circuitry with an external processor specifying tests to be run and receiving results of the tests;
   fabricating and installing supporting test circuitry resident on-board the digital integrated circuit under test, the supporting test circuitry including a second set of I/O ports arranged in a second fixed interface circuit operable with any digital integrated circuit under test, the second fixed interface circuit interfacing the stand-alone test circuitry with the digital integrated circuit under test;
   connecting the first set of I/O ports of the stand-alone test circuitry to the corresponding second set of I/O ports of the supporting test circuitry;
   selecting a specific port to apply and receive test data to and from;
   testing and characterizing the digital integrated circuit under test, the stand-alone test circuitry applying stimuli to and capturing results from the digital integrated circuit under test;
   utilizing a moderate frequency clock in the stand-alone test circuitry to scan in/out the test data/results and perform functional characterization of the digital integrated circuit under test, wherein the moderate frequency clock has a frequency range between approximately 50 MHz and approximately 100 MHz;
   providing a high-frequency clock in said support test circuitry, the high-frequency clock performing speed characterization of the digital integrated circuit under test, wherein the high-frequency clock has a frequency greater than 100 MHz;
   providing a frequency measuring circuit (FMC) operable with said high-frequency clock, said frequency measuring circuit counting a number of high-frequency clock cycles within a predetermined time period and transmitting the counted number to a user via a clock frequency output signal;
   providing first, second, third, and fourth operational states of said frequency measuring circuit, wherein:
      the first operational state waits for a frequency measurement request from said stand-alone test circuitry to start, commands said high-frequency counter to clear upon receipt of said frequency measurement request, and performs a state transition to the second operational state;
      the second operational state of said frequency measuring circuit waits for said high-frequency clock counter to be cleared, and once said high frequency clock counter is cleared, the second operational state enables counting the frequency while transitioning to the third operational state;

the third operational state of said frequency measuring circuit counts the high-frequency clock cycles while waiting for a measurement request de-activation by said stand-alone test circuitry, and upon de-activation of said measurement request, the third operational state stops said counting and transitions to the fourth operational state; and the fourth operational state of said frequency measuring circuit waits for synchronization, then signals said stand-alone test circuitry indicating that frequency measurement is complete and loads a value of the counted frequency into a frequency register available to said user;

serializing and de-serializing data communication between said stand-alone test circuitry and the digital integrated circuit under test, said test support circuitry converting received serial test data to parallel data and applying the parallel data to the digital integrated circuit under test, said test support circuitry also converting back captured test results from parallel form to serial form; and transmitting the results captured by the stand-alone test circuitry to the external processor.

2. The digital integrated circuit testing and characterization method according to claim 1, further comprising the step of resetting said frequency measuring circuit to the first operational state upon completion of the fourth operational state.

3. The digital integrated circuit testing and characterization method according to claim 2, further comprising the steps of:
providing a selection mask for the step of selecting said specific port to apply/receive test data to/from; and
serially loading the selection mask via a selection mask strobe signal.

4. The digital integrated circuit testing and characterization method according to claim 3, wherein said step of serializing and de-serializing data communication between said stand-alone test circuitry and said digital integrated circuit under test further comprises the steps of:
providing a k-bits wide test application port (TAP), and an l-bits wide test results port (TRP), the TAP applying primary inputs to said digital integrated circuit under test and the TRP capturing primary outputs from said digital integrated circuit under test;
utilizing shift registers for scanning in/out the test data/results appearing at the TAP and the TRP; and
utilizing parallel-load registers for applying and capturing the test data/results appearing at the TAP the TRP.

5. The digital integrated circuit testing and characterization method according to claim 4, further comprising the steps of:
selecting a required test clock selected from the group consisting of said moderate frequency clock and said high frequency clock, based on command input from said stand-alone test circuitry;
applying exactly two pulses of the selected clock to said TAP and TRP ports responsive to a selection input strobe;
accepting a trigger from said stand-alone test circuitry, the trigger lasting for at least two cycles of the selected clock;
producing exactly two pulses of the selected clock for the trigger;
waiting a duration of at least two cycles where the trigger is absent before allowing the selected clock to fire again;
ensuring the produced two pulses are complete; and
gating output from the selected clock.

6. The digital integrated circuit testing and characterization method according to claim 3, wherein said step of serializing and de-serializing data communication between said stand-alone test circuitry and said digital integrated circuit under test further comprises the steps of:
providing a full-scan chain for debugging/diagnostics of said digital integrated circuit under test and to fully test said digital integrated circuit under test when said integrated circuit is a sequential circuit; and
providing a special test application port (TAP), and a special test results port (TRP) operable in combination with the full-scan chain, the TAP applying inputs to scan internal Flip-Flops of said digital integrated circuit under test and the TRP capturing outputs from the internal Flip-Flops of said digital integrated circuit under test, the TAP and the TRP being selected in pairs.

7. The digital integrated circuit testing and characterization method according to claim 6, further comprising the steps of:
selecting a required test clock selected from the group consisting of said moderate frequency clock and said high frequency clock, based on command input from said stand-alone test circuitry;
applying exactly two pulses of the selected clock to said TAP and TRP ports responsive to a selection input strobe;
accepting a trigger from said stand-alone test circuitry, the trigger lasting for at least two cycles of the selected clock;
producing exactly two pulses of the selected clock for the trigger;
waiting a duration of at least two cycles where the trigger is absent before allowing the selected clock to fire again;
ensuring the produced two pulses are complete; and
gating output from the selected clock.

8. A digital integrated circuit testing and characterization system, comprising:
stand-alone test circuitry for a digital integrated circuit under test, the stand-alone test circuitry having:
a processor implemented as a datapath;
a micro-coded control unit connected to the processor;
a first set of I/O ports controlled by the processor and forming a first fixed interface circuit operable with any digital integrated circuit under test, the first fixed interface circuit being adapted for interfacing the stand-alone test circuitry with an external processor specifying tests to be run and receiving results of the tests;
means for applying stimuli to and capturing results from the digital integrated circuit under test in order to test and characterize the digital integrated circuit under test;
means for transmitting results captured by the stand-alone test circuitry to the external processor;
a moderate frequency clock and means for utilizing the moderate frequency clock for scanning in and out the test data and results and performing functional characterization of the digital integrated circuit under test, wherein the moderate frequency clock has a frequency range between approximately 50 MHz and approximately 100 MHz; and
means for serializing and de-serializing data communication between said stand-alone test circuitry and said digital integrated circuit under test, said means for serializing and de-serializing data communication between said stand-alone test circuitry and said digital integrated circuit under test comprising:
means for providing a full-scan chain for debugging/diagnostics of said digital integrated circuit under test and to fully test said digital integrated circuit under test when said integrated circuit is a sequential circuit;

means for providing special test application port (TAP), and special test results port (TRP) operable in combination with said full-scan chain, the TAP including means for applying inputs to scan internal Flip-Flops of said digital integrated circuit under test and the TRP including means for capturing outputs from said internal Flip-Flops of said digital integrated circuit under test, the TAP and the TRP being selected in pairs, the TAP being a k-bits wide test application port, and the TRP being an l-bits wide test results port, said k-bits wide test application port including means for applying primary inputs to said digital integrated circuit under test and said l-bits wide test results port including means for capturing primary outputs from said digital integrated circuit under test;

means for scanning in/out the test data/results appearing at the TAP and the TRP; and means for applying/capturing the test data/results appearing at the TAP and the TRP;

supporting test circuitry resident on-board the digital integrated circuit under test, the supporting test circuitry comprising:

a second set of I/O ports forming a second fixed interface circuit operable with any digital integrated circuit under test, the second fixed interface circuit interfacing the stand-alone test circuitry with the digital integrated circuit under test, the first set of I/O ports of the stand-alone test circuitry being connected to the corresponding second set of I/O ports of the supporting test circuitry;

means for converting received serial test data to parallel data and applying the parallel data to the digital integrated circuit under test;

means for converting test results captured from the circuit under test from parallel form to serial form;

a high-frequency clock, the system further comprising means for utilizing the high-frequency clock to perform speed characterization of the digital integrated circuit under test, wherein the high-frequency clock has a frequency greater than 100 MHz; and means for measuring a frequency operable with said high frequency clock, said frequency measuring means including means for counting a number of high-frequency clock cycles within a predetermined time period and means for transmitting said counting number to a user via a clock frequency output signal;

means for selecting a required test clock from the group consisting of said moderate frequency clock and said high frequency clock, based on command input from said stand-alone test circuitry;

means for synchronizing the selected clock according to a trigger input from said stand-alone test circuitry; and means for gating the selected clock according to gating circuitry operable with the selected clock.

9. The digital integrated circuit testing and characterization system according to claim 8, further comprising means for selecting a specific port to apply/receive test data to and from.

* * * * *